(12) United States Patent
Arik et al.

(10) Patent No.: US 7,878,232 B2
(45) Date of Patent: Feb. 1, 2011

(54) LIGHT EMITTING CHIP APPARATUSES WITH A THERMALLY SUPERCONDUCTING HEAT TRANSFER MEDIUM FOR THERMAL MANAGEMENT

(75) Inventors: Mehmet Arik, Niskayuna, NY (US); Stanton Earl Weaver, Jr., Northville, NY (US)

(73) Assignee: GE Lighting Solutions, LLC, Cleveland, OH (US)

( * ) Notice: Subject to any disclaimer, the term of this patent is extended or adjusted under 35 U.S.C. 154(b) by 1475 days.

(21) Appl. No.: 10/887,601

(22) Filed: Jul. 9, 2004

(65) Prior Publication Data
US 2006/0005947 A1    Jan. 12, 2006

(51) Int. Cl.
*F28F 7/00* (2006.01)
*F28D 15/00* (2006.01)
*F21V 29/00* (2006.01)

(52) U.S. Cl. ............ 165/80.2; 165/104.13; 165/104.15; 165/104.33; 362/294

(58) Field of Classification Search ............ 165/104.21, 165/104.26, 104.33, 80.2, 104.15; 362/294
See application file for complete search history.

(56) References Cited

U.S. PATENT DOCUMENTS

| | | | |
|---|---|---|---|
| 4,590,993 A | 5/1986 | Kurzweg | |
| 5,077,103 A | 12/1991 | Wagner et al. | |
| 5,260,142 A | 11/1993 | Kawabe et al. | |
| 5,268,812 A * | 12/1993 | Conte | 165/104.33 |
| 5,355,942 A | 10/1994 | Conte | |
| 5,542,471 A | 8/1996 | Dickinson | |
| 6,132,823 A | 10/2000 | Qu | |
| 6,553,948 B1 | 4/2003 | Luo | |
| 6,591,615 B1 | 7/2003 | Luo | |
| 6,612,115 B2 | 9/2003 | Luo | |
| D481,451 S | 10/2003 | Luo | |

(Continued)

FOREIGN PATENT DOCUMENTS

DE    10244625    1/2004

(Continued)

OTHER PUBLICATIONS

Zeng et al., "Application of Chemical Heat Pipe Using $SO_2/SO_3$ Reversible Thermochemical . . . ", International Atomic Energy Agency, TECDOC-761, pp. 102-107 (Oct. 1992) at http://www.iaea.org/inis/aws/htgr/abstracts/abst_25067248.html.

(Continued)

*Primary Examiner*—Ljiljana (Lil) V Ciric
(74) *Attorney, Agent, or Firm*—Fay Sharpe LLP (57) ABSTRACT

A light emitting apparatus (10, 110, 210, 310, 410) includes one or more light emitting chips (12, 112, 212, 312, 412) and a support (13, 14, 114, 214, 314, 414) on which the light emitting chips are disposed. The support includes a first side on which the light emitting chips are attached and a second side opposite the first side. A thermally superconducting heat transfer medium (22, 122, 222, 322, 422) is disposed in an interior volume of the support and thermally connects the first and second sides of the support. The thermally superconducting heat transfer medium has a thermal conductivity at least 1500 times greater than the thermal conductivity of copper.

15 Claims, 4 Drawing Sheets

U.S. PATENT DOCUMENTS

| | | | |
|---|---|---|---|
| D481,452 S | 10/2003 | Luo | |
| D485,612 S | 1/2004 | Luo | |
| D485,901 S | 1/2004 | Luo | |
| 6,672,095 B1 | 1/2004 | Luo | |
| 6,711,018 B2 | 3/2004 | Luo | |
| 6,746,295 B2 | 6/2004 | Sorg | |
| 6,759,803 B2 | 7/2004 | Sorg | |
| 6,864,571 B2 | 3/2005 | Arik et al. | |
| 6,911,231 B2 * | 6/2005 | Qu | 427/190 |
| 6,916,430 B1 * | 7/2005 | Qu | 252/71 |
| 7,011,431 B2 * | 3/2006 | Ono et al. | 362/294 |
| 7,045,828 B2 * | 5/2006 | Shimizu et al. | 257/98 |
| 7,095,110 B2 | 8/2006 | Arik et al. | |
| 2002/0151161 A1 * | 10/2002 | Furusawa | 438/597 |
| 2002/0182332 A1 | 12/2002 | Qu | |
| 2003/0217837 A1 | 11/2003 | Luo | |
| 2004/0000158 A1 | 1/2004 | Luo | |
| 2004/0000394 A1 | 1/2004 | Luo | |

FOREIGN PATENT DOCUMENTS

| | | |
|---|---|---|
| EP | 1369918 | 12/2003 |
| GB | 2390482 | 1/2004 |
| WO | WO 98/19859 | 5/1998 |
| WO | WO 02/35091 | 5/2002 |
| WO | WO 02/48621 A1 | 6/2002 |

OTHER PUBLICATIONS

QuEnergy International Corporation, Heat Transfer Technology and Electronics Applications at http://www.quenergy.net, pp. 1, 1-3, 1-6 (Feb. 2004).

International Search Report from PCT/US2005/24255.

* cited by examiner

LIGHT EMITTING CHIP APPARATUSES WITH A THERMALLY SUPERCONDUCTING HEAT TRANSFER MEDIUM FOR THERMAL MANAGEMENT

BACKGROUND

The present invention relates to the lighting arts. It especially relates to high intensity light emitting diode chip packages, components, apparatuses, and so forth, and will be described with particular reference thereto. However, the invention will also find application in conjunction with other solid state light emitting chips such as vertical cavity surface emitting lasers, organic light emitting chips, and the like.

High power light emitting diode packages employ one or more light emitting chips operating at relatively high current levels to produce high brightness or high light output intensities. A light emitting diode chip has a voltage drop which typically is determined largely by the band gap of the material. The operating voltage of a light emitting diode chip is typically about 4 volts or less. Thus, generating high light output intensities involves increasing the operating current to increase the input power level. A high operating current, in turn, leads to high resistive losses in cladding layers, electrodes, wire bonds, printed circuit traces, or other electrically resistive elements in the current path.

These resistive losses translate into substantial heating of the light emitting package when operated at high power levels. Heating can produce thermal degradation of the light emitting diode chip, the chip electrodes, sealing encapsulant, solder bumps, or other components of the light emitting package. Moreover, heating generally increases the resistance of the electrical pathways and can reduce the light emission efficiency. As a consequence, the light output power increase is proportionally smaller than the input electrical power increase.

Various thermal management techniques have been employed in light emitting diode packages. Encapsulating epoxies, sub-mounts, and the like are selected to provide high thermal conductivity to promote heat transfer away from the operating light emitting diode chips. Heat sinks are provided to collect and dissipate the generated heat. Chip electrodes are distributed across the chip area to provide current and heat distribution. Encapsulants and other thermally sensitive materials are chosen for good thermal stability and robustness. These design techniques reduce, but do not eliminate, thermal concerns in high brightness light emitting chip packages.

The present invention contemplates improved apparatuses and methods that overcome the above-mentioned limitations and others.

BRIEF SUMMARY

According to one aspect, a light emitting apparatus is disclosed, including a plurality of light emitting chips 12 and a substantially isothermal printed circuit board 13 on which the light emitting chips are disposed. The substantially isothermal printed circuit board 13 includes: (i) an electrically insulating board 13a; (ii) printed circuitry 30 disposed on or in the insulating board 13a and connecting with the light emitting chips 12; and (iii) a heat spreader 14 including a thermally superconducting heat transfer medium 22 disposed in an interior volume 16. The thermally superconducting heat transfer medium 22 has a thermal conductivity at least 1500 times greater than the thermal conductivity of copper.

According to another aspect, a light emitting apparatus is disclosed, including a light emitting chip having electrodes and a sub-mount. The sub-mount includes: (i) a first side to which the light emitting chip is attached, the first side including bonding pads electrically connected with the electrodes of the light emitting chip; (ii) a second side opposite the first side; and (iii) a thermally superconducting heat transfer medium disposed in an interior volume of the sub mount. The thermally superconducting heat transfer medium has a thermal conductivity at least 1500 times greater than the thermal conductivity of copper.

According to yet another aspect, a light emitting apparatus is disclosed, including one or more light emitting chips and a heat pipe. The heat pipe has a first side supporting the one or more light emitting chips and a second side opposite the first side, and further includes a thermally superconducting heat transfer medium thermally connecting the first and second sides. The thermally superconducting heat transfer medium has a thermal conductivity at least 1500 times greater than the thermal conductivity of copper.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. In the drawings, layer thicknesses, coating thicknesses, and other dimensions are not drawn to scale.

DETAILED DESCRIPTION OF PREFERRED EMBODIMENTS

Figure 1A:
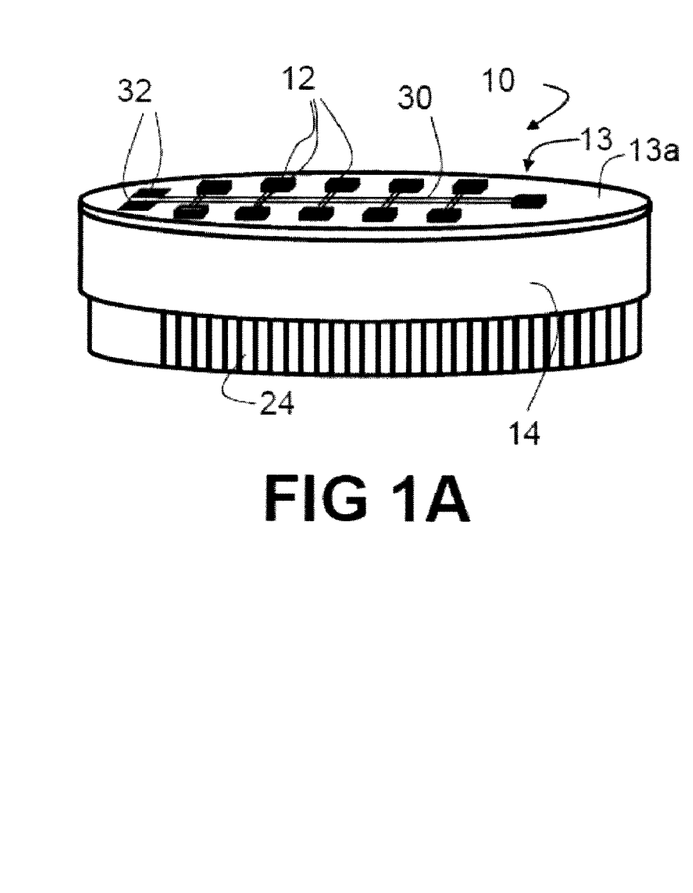
FIGS. 1A and 1B show perspective and sectional views, respectively, of a light emitting apparatus including a metal core printed circuit board in which the metal core includes a thermally superconducting medium.
Figure 1B:
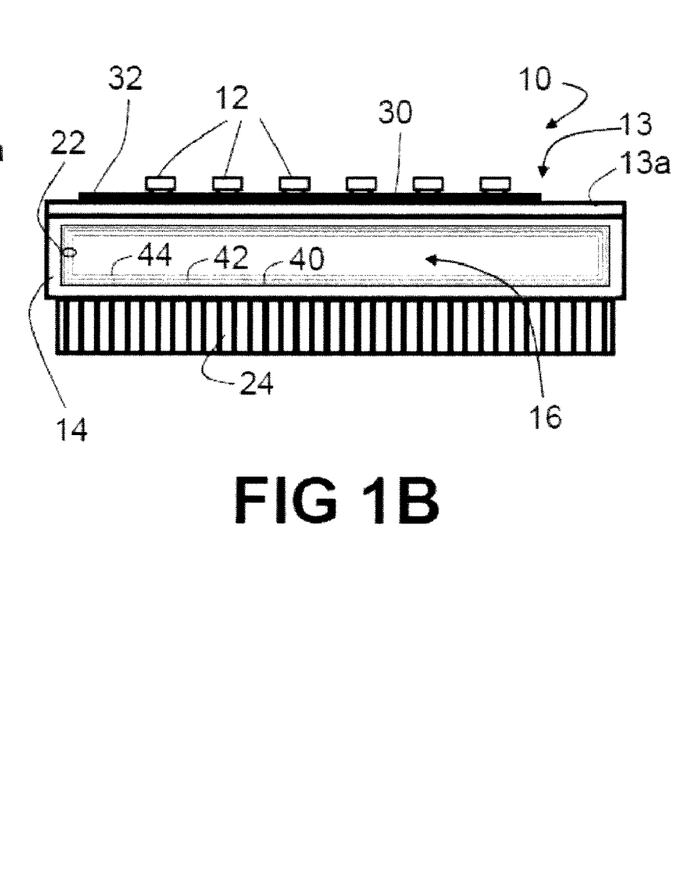

With reference to FIGS. 1A and 1B, a light emitting package 10 includes a plurality of light emitting diode chips 12 disposed on an electrically insulating board 13a of a printed circuit board 13 which in turn is mounted on a first principal surface of a generally planar support 14. The printed circuit board 13 together with the generally planar support 14 define a metal core printed circuit board, in which the generally planar support 14 is the metal core of the metal core printed circuit board.

The support 14 is a generally planar support having an open interior volume 16. A thermally superconducting heat transfer medium 22 is disposed on inside surfaces of the enclosed volume 16. The thermally superconducting heat transfer medium has a thermal conductivity that is at least 1500 times larger than the thermal conductivity of copper. A heat sink 24 is disposed on a second principal surface opposite the first principal surface on which the plurality of light emitting diode chips 12 are disposed. Printed circuitry 30 disposed on the electrically insulating board 13a of the printed circuit board 13 defines a power bus connecting the light emitting diode chips 12 with electrical power input pads 32. Rather than having printed circuitry 30 arranged on the electrically insulating board 13a of the printed circuit board 13, as shown, the printed circuitry can instead be disposed inside the printed circuit board, for example sandwiched between two insulative layers. Multiple layers of printed circuitry can be included, with insulative layers disposed between each layer of printed circuitry.

In operation, electrical power applied to the pads 32 electrically energizes the light emitting diode chips 12 to emit light. The energized light emitting diode chips 12 also produce substantial quantities of heat. This heat can lead to at least two deleterious effects: (i) an overall heating of the end of the support 14 on which the light emitting diode chips 12 are disposed; and (ii) lateral thermal non-uniformity across the end of the support 14 on which the light emitting diode chips 12 are disposed. The overall heating can lead to lowered efficiency and thermal degradation of the chips 12. Temperature non-uniformity can lead to differences in the operating efficiency of the light emitting chips 12, which in turn can lead to brightness non-uniformity and possibly color non-uniformity in the light emitting package.

To address these thermal issues, the thermally superconducting heat transfer medium 22 transfers heat from light emitting chips 12 to the heat sink 24, and also improves lateral heat spreading across the areas between the light emitting chips 12 to improve temperature uniformity. The thermally superconducting heat transfer medium 22 and the support 14 act as a heat pipe that absorbs heat from the hotter principle surface on which the printed circuit board 13 is disposed and transfers the absorbed heat to the opposite principal surface of the support 14 on which the heat sink 24 is disposed. The absorbed heat is released and taken up and dissipated by the heat sink 24. The thermally superconducting heat transfer medium 22 also spreads heat generated by the light emitting diode chips 12 across the principal surface on which the printed circuit board 13 is disposed, thus reducing thermal non-uniformities across the printed circuit board 13.

In some preferred embodiments, the thermally superconducting heat transfer medium is a mixture of inorganic powders. Some such powder-based superconducting heat transfer media are disclosed in Y. Qu, U.S. Pat. No. 6,132,823 (hereinafter Qu '823). The inorganic powder superconducting heat transfer media of Qu '823 generally include three layers 40, 42, 44. The first layer 40 comprises at least one compound selected from the group consisting of sodium peroxide, sodium oxide, beryllium oxide, manganese sesquioxide, aluminum dichromate, calcium dichromate, boron oxide, dichromate radical, and combinations thereof. The second layer 42 comprises at least one compound selected from the group consisting of cobaltous oxide, manganese sesquioxide, beryllium oxide, strontium chromate, strontium carbonate, rhodium oxide, cupric oxide, β-titanium, potassium dichromate, boron oxide, calcium dichromate, manganese dichromate, aluminum dichromate, dichromate radical, and combinations thereof. The third layer 44 comprises at least one compound selected from the group consisting of denatured rhodium oxide, potassium dichromate, denatured radium oxide, sodium dichromate, silver dichromate, monocrystalline silicon, beryllium oxide, strontium chromate, boron oxide, sodium peroxide, β-titanium, a metal dichromate, and combinations thereof.

Some suitable specific compositions of and methods for forming the thermally superconducting heat transfer medium 22, methods disposing the thermally superconducting heat transfer medium 22 inside the volume 16, and methods for sealing the volume 16, are described in Qu '823. Specific suitable compositions of powder-based thermally superconducting heat transfer media 22 are available under the trade name QUTECH™ from QuEnergy International Corporation, Diamond Bar, Calif., USA, which typically provides the QUTECH™ thermally superconducting heat transfer media 22 pre-sealed in a metal or other thermally conductive container.

Thermally superconducting heat transfer media have substantial advantages over other heat management components and techniques. The thermal conductivity of these media is large. The thermally superconducting media of Qu '823, for example, are reported in that reference to have thermal conductivities that are 20,000-30,000 times higher than the thermal conductivity of silver. The present inventors have measured thermal conductivities greater than 1500 times higher than the thermal conductivity of copper in heat pipes employing QUTECH™ thermally superconducting heat transfer media.

Although high thermal conductivity is important, for multi-chip light emitting diode packages thermal uniformity across the printed circuit board or other support is also important. A substantially isothermal support surface for the array of light emitting chips ensures good brightness and color uniformity of the array. High thermal conductivity by itself does not ensure substantially isothermal characteristics. For example, Qu '823 reports that heat in the thermally superconducting media disclosed therein is conducted at a rate of 15,000 meters per second, regardless of the heat conductivity coefficient of the material of the conduit.

The inventors have measured excellent isothermal characteristics for a 20 centimeter long heat pipe from QuEnergy which contains thermally superconducting heat transfer media. With about a 50° C. temperature differential applied to the ends of the heat pipe, the temperature along the heat pipe varied by less than about 2° C. along the entire 20 centimeter length. This heat pipe had an outer diameter of 6 millimeters, and is unsuitable for supporting an array of light emitting diode chips. However, this example illustrates the excellent isothermal characteristics of thermally superconducting heat transfer media.

Figure 2A:
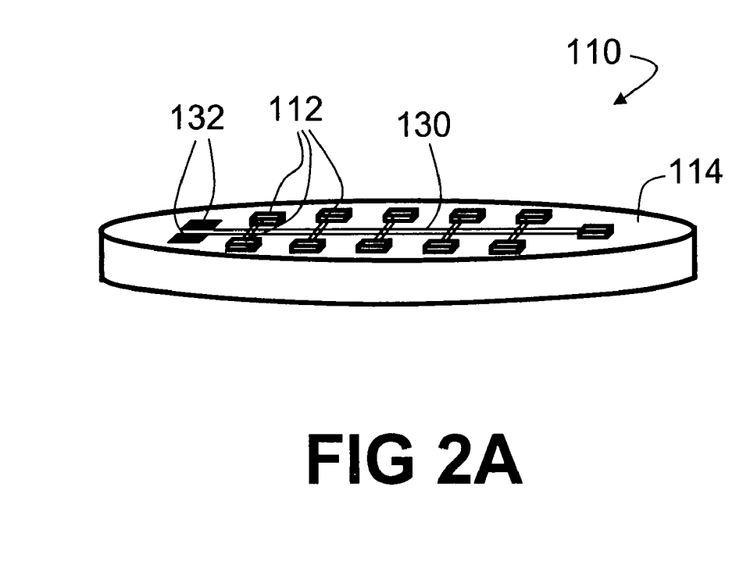
FIGS. 2A and 2B show perspective and sectional views, respectively, of a light emitting apparatus including a substantially isothermal printed circuit board including a thermally superconducting heat transfer medium for spreading heat.
Figure 2B:
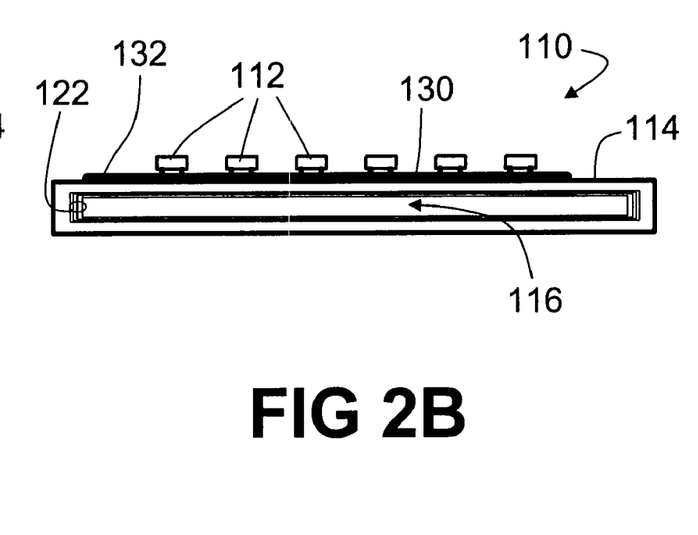

With reference to FIGS. 2A and 2B, a light emitting package 110 includes a plurality of light emitting diode chips 112 disposed on a substantially isothermal printed circuit board 114. The substantially isothermal printed circuit board 114 is generally planar and has an open interior volume 116. A thermally superconducting heat transfer medium 122 is disposed on inside surfaces of the open interior volume 116 to provide the printed circuit board 114 with substantially isothermal characteristics. Printed circuitry 130 disposed on the printed circuit board 114 define a power bus connecting the light emitting diode chips 112 with electrical power input pads 132. At least the top principal surface of the printed circuit board 114 should be electrically insulating to prevent shunting of the printed circuitry 130.

In operation, electrical power applied to the pads 132 electrically energizes the light emitting diode chips 112 to emit light. The heat transfer medium 122 spreads heat generated by the light emitting diode chips 112 across the printed circuit board 114 to reduce or eliminate the formation of thermal "hotspots" near individual light emitting chips, thus providing the printed circuit board 114 with substantially isothermal characteristics. Moreover, if the printed circuit board 114 is mounted by thermally conductive adhesive or another thermally conductive connection to an associated heat sink, thermal reservoir, or other associated high thermal capacity support, then the heat transfer medium 122 also acts as a heat pipe to transfer heat from the light emitting diode chips 112 to the high thermal capacity support.

The open interior volume 116 of the substantially isothermal printed circuit board 114 is substantially planar. In one contemplated variation, this open interior volume 116 is divided into a plurality of parallel tubular volumes. Optionally, each have tubular volume has its own separate tubular housing, thus defining a parallel array of heat pipes embedded into the printed circuit board. If one set of parallel heat pipes is embedded, then substantial thermal anisotropy is introduced since thermal flow along the length of the tubular heat pipes will be much larger than thermal flow transverse to the heat pipes. This anisotropy can be reduced by further providing a second set of parallel tubular heat pipes oriented transverse to the first set. Those skilled in the art can readily employ other interior volume geometries in specific printed circuit boards to achieve selected heat spreading characteristics.

An advantage of the powder-based thermally superconducting heat transfer medium is that it's thermal characteristics have limited dependency upon gravity, acceleration, or other forces. Without limiting the invention to any particular mode of operation, it is believed that the superconducting heat transfer is achieved principally through solid state conduction, gas phase convection, a combination of exothermic and endothermic chemical reactions, phonon vibrations, or some combination thereof. These heat transfer mechanisms are substantially independent of gravity, acceleration, or other forces, as compared with heat transfer by fluid flow, capillary action, and other mechanisms involving more substantial mass transport.

Figure 3A:
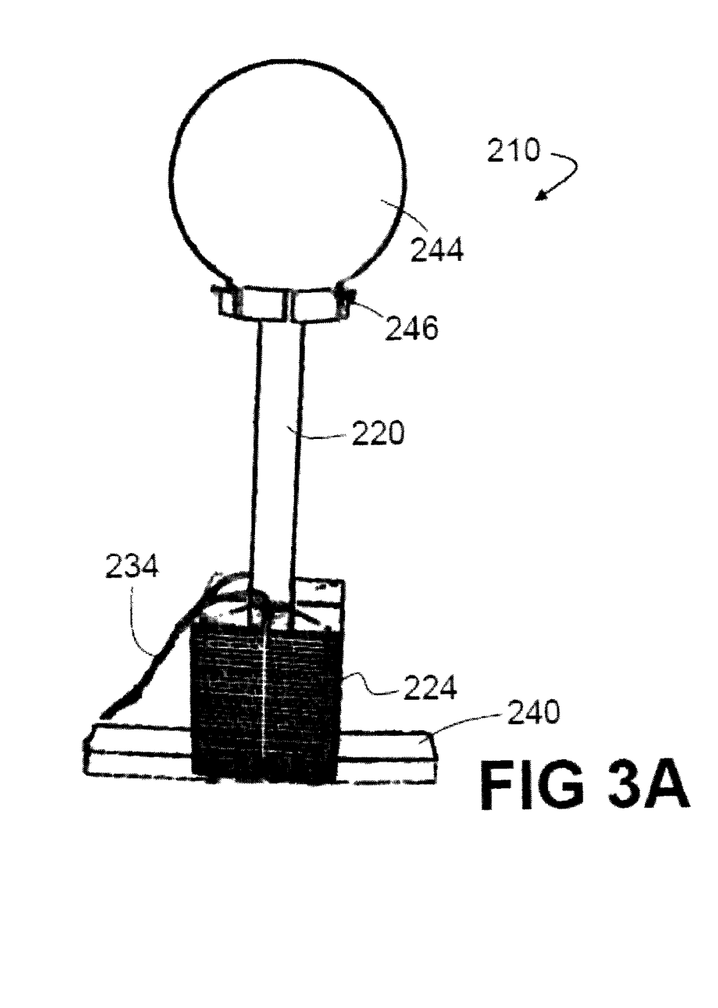
FIG. 3A shows a perspective view of a street light.
Figure 3B:
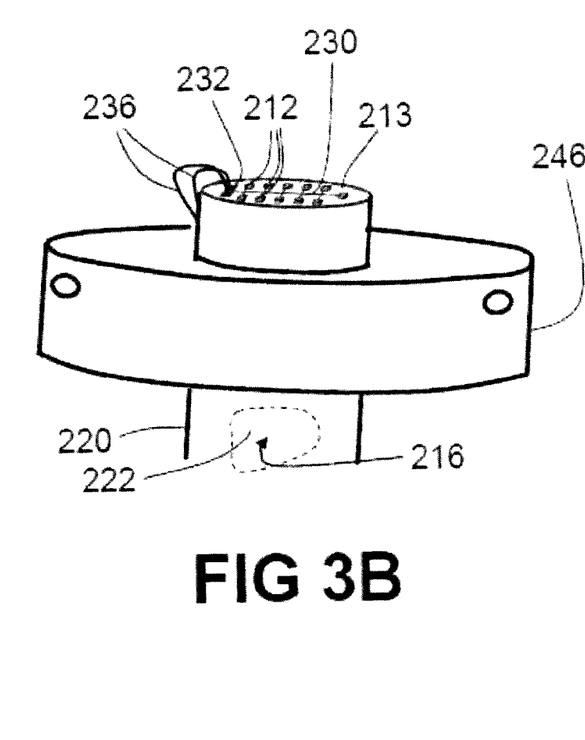
FIG. 3B shows a perspective view of a top portion of the street light of FIG. 3A, with the light diffusing globe removed.

With reference to FIGS. 3A and 3B, a street light 210 includes a plurality of light emitting diode chips 212 disposed on a printed circuit board 213. The printed circuit board 213 is a generally planar end of a heat pipe 214 having an interior volume 216 containing a thermally superconducting heat transfer medium 222. (The interior volume 216 and the thermally superconducting heat transfer medium 222 are shown by partial cutaway of the heat pipe 214 in FIG. 3B). A heat sink 224 is disposed at the opposite end of the heat pipe 214 from the printed circuit board 213. Printed circuitry 230 disposed on the printed circuit board 213 define a power bus connecting the light emitting diode chips 212 with electrical power input pads 232. Electrical power from an electrical power cord 234 is transmitted via electrical conductors 236 bonded to the electrical power input pads 232 to energize the light emitting diode chips 312.

The heat pipe 214 forms the vertical support post of the street light 210. The street light 210 also includes a mounting bracket, mounting stand, mounting base 240 or the like connected with the heat sink 224 for securing or mounting the street light 210 to the ground with the post defined by the tubular heat pipe 214 arranged in a vertical position with the light emitting diode chips 212 at the top of the post defined by the heat pipe 214. In the illustrated embodiment, a transparent light diffusing globe 244 is mounted over the light emitting diode chips 212 to diffuse light emitted by the light emitting diode chips 212. The light diffusing globe 244 has an open end into which the printed circuit board 213 and a portion of the heat pipe 214 extends. A mounting bracket 246 secured by bolts, adhesive, welding, or the like to the heat pipe 214 is used to removably secure the open end of the light diffusing globe 244 over the light emitting diode chips 212.

In operation, the light emitting diode chips 212 produce heat that is transferred by the heat pipe 214 to the heat sink 224, where it is dissipated. Advantageously, the street light 210 can also be used in a horizontal orientation, since the inventors have found that the heat transfer characteristics of the thermal superconductor-based heat pipe 214 are similar in the horizontal and vertical orientations. In contrast, a degradation of heat transfer efficiency of as much as 50% is observed in conventional heat pipes between horizontal and vertical orientations.

Figure 4:
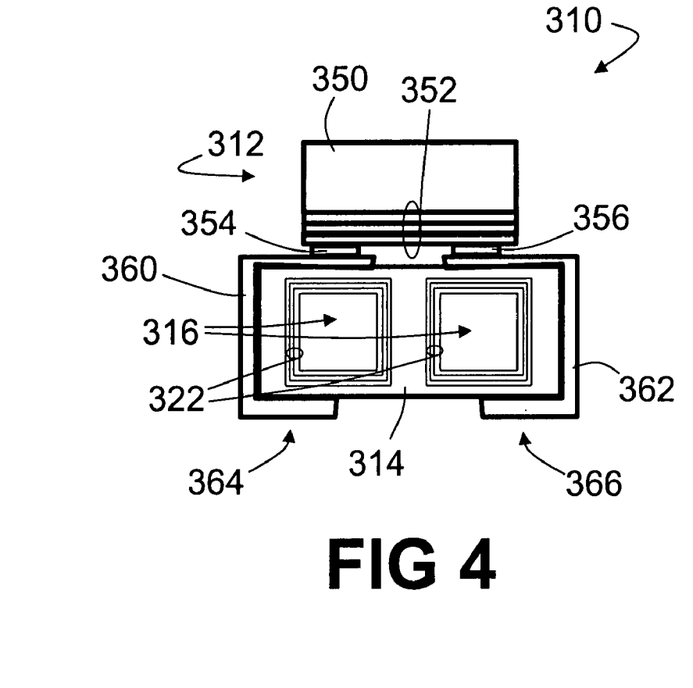
FIG. 4 shows a sectional view of a flip-chip light emitting diode component including a sub-mount containing a thermally superconducting heat transfer medium.

With reference to FIG. 4, a light emitting apparatus 310 includes a light emitting diode chip 312 flip-chip bonded to a sub-mount 314. The sub-mount 314 includes open volumes 316, specifically two open volumes in the illustrated embodiment. Each open volume 316 includes a thermally superconducting heat transfer medium 322 disposed on inside surfaces of the volume 316. In preferred embodiments, the heat transfer medium 322 is one of the thermally superconducting heat transfer media described in Qu '823. In the flip-chip arrangement of the light emitting package 310, the light emitting diode chip 312 includes a substrate 350 that is substantially light transmissive for light generated by device layers 352. In some embodiments, the substrate 350 is sapphire, silicon carbide, or gallium nitride, and the device layers 352 are group III-nitride semiconductor layers such as gallium nitride layers, aluminum nitride layers, indium nitride layers, and ternary and quaternary alloys thereof, with each layer doped n-type or p-type intentionally or through background doping so that the device layers 352 collectively define a p/n or n/p group III-nitride light emitting diode. Front-side electrodes 354, 356 formed on the device layers 352 are flip-chip bonded to respective electrical conductors 360, 362 of the sub-mount 314. In the illustrated embodiment, the electrical conductors 360, 362 are printed conductive traces that wrap around from the side of the sub-mount 314 on which the light emitting diode chip 312 is flip-chip bonded to the opposite side of the sub-mount 314, where the printed conductive traces 360, 362 provide bonding surfaces 364, 366 for surface mounting the light emitting package or component 310 to electrical pads of an associated printed circuit board, electrical system, or other support.

In operation, the light emitting diode chip 312 produces heat that is conducted to the sub-mount 314. The thermally superconducting heat transfer medium 322 promotes distribution of this heat through the sub-mount 314 to avoid hotspots, and the sub-mount 314 including the thermally superconducting heat transfer medium 322 also acts as a heat pipe transferring heat from the chip 312 to the bonding surfaces 364, 366 where the heat is absorbed by the associated printed circuit board, electrical system, or other support. In the illustrated embodiment, there are two volumes 316, one disposed under each electrode 354, 356 of the light emitting diode chip 312, since the electrodes are typically good heat conduits. Alternatively, a single volume spanning both electrodes can be used. Moreover, the thermally superconducting heat transfer medium 322 advantageously also removes heat from the electrical conductors 360, 362 wrapped around the sub-mount 314.

Figure 5:
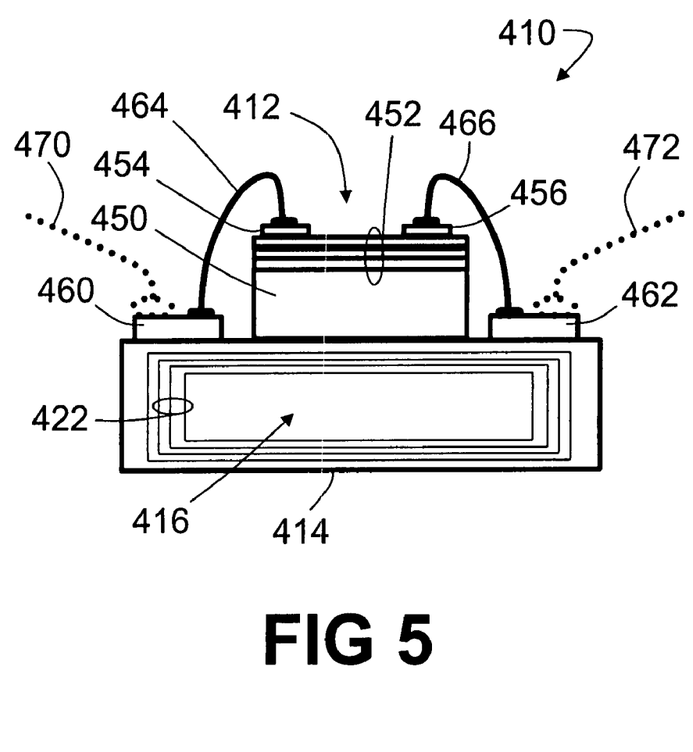
FIG. 5 shows a sectional view of a non-inverted, wire-bonded light emitting diode component including a sub-mount containing a thermally superconducting heat transfer medium.

With reference to FIG. 5, a light emitting apparatus 410 includes a light emitting diode chip 412 bonded in a non-inverted orientation to a sub-mount 414. The sub-mount 414 includes an open volume 416 containing a thermally superconducting heat transfer medium 422 disposed on inside surfaces. In the flip-chip arrangement of the light emitting package 410, the light emitting diode chip 412 includes a substrate 450, which may be transparent or opaque, supporting device layers 452. In some embodiments, the substrate 450 is sapphire, silicon carbide, or gallium nitride, and the device layers 452 are group III-nitride semiconductor layers such as gallium nitride layers, aluminum nitride layers, indium nitride layers, and ternary and quaternary alloys thereof, with each layer doped n-type or p-type intentionally or through background doping so that the device layers 452 collectively define a p/n or n/p group III-nitride light emitting diode. Front-side electrodes 454, 456 formed on the device layers 452 are electrically connected with bonding pads 460, 462 of the sub-mount 414 via wire bonds 464, 466. The side of the sub-mount 414 opposite from the side on which the light emitting diode chip 412 is disposed is preferably adapted to be soldered or otherwise secured to an associated printed circuit board, electrical system, or other support. In the illustrated embodiment, the bonding pads 460, 462 are large enough to allow the light emitting package or component 410 to be electrically connected to the associated printed circuit board, electrical system, or other support by an associated second set of wire bonds 470, 472 (portion of the associated wire bonds 470, 472 are shown in phantom in FIG. 5). Alternatively, a second set of bonding pads can be provided on the sub-mount for connecting the light emitting component with the associated printed circuit board, electrical system, or other support.

FIGS. 4 and 5 illustrate two embodiments of light emitting diode packages or components, in which each illustrated embodiment has a sub-mount containing a thermally superconducting heat transfer medium. The inventors have estimated that a high brightness light emitting diode package producing about 1.3 W of heat and employing an aluminum nitride sub-mount with a 2.12 K/W average thermal resistance produces a temperature gradient of about 2.75° C. across the sub-mount. In contrast, by incorporating the thermally superconducting heat transfer media 322, 422 into the sub-mounts 314, 414, the sub-mount thermal resistance can be expected to be reduced to below 0.04 K/W, and the resulting temperature gradient is expected to be less than about 0.05° C. Similarly, a high brightness light emitting diode package producing about 5 W of heat and employing the aluminum nitride sub-mount with 2.12 K/W average thermal resistance produces a temperature gradient of about 10.6° C. across the sub-mount. The sub-mounts 314, 414 incorporating the thermally superconducting heat transfer media 322, 422 can be expected to reduce this thermal gradient to less than about 0.2° C.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A light emitting apparatus comprising:
a plurality of light emitting chips; and
a substantially isothermal printed circuit board on which the plurality of light emitting chips are disposed, the substantially isothermal printed circuit board including: (i) an electrically insulating board, (ii) printed circuitry disposed on or in the insulating board and connecting with the plurality of light emitting chips, and (iii) a heat spreader including a thermally superconducting heat transfer medium disposed in an interior volume of the heat spreader, the thermally superconducting heat transfer medium having a finite thermal conductivity at least 1500 times greater than the thermal conductivity of copper.

2. The light emitting apparatus as set forth in claim 1, wherein the interior volume of the heat spreader comprises:
a plurality of interior volumes.

3. The light emitting apparatus as set forth in claim 1, wherein the heat spreader comprises:
a generally planar support for the electrically insulating board, the interior volume of the heat spreader being generally planar and disposed inside the generally planar support.

4. The light emitting apparatus as set forth in claim 3, wherein the substantially isothermal printed circuit board is a metal core printed circuit board, and the heat spreader comprises:
a metal core of the substantially isothermal printed circuit board.

5. The light emitting apparatus as set forth in claim 1, wherein the thermally superconducting heat transfer medium is a powder-based thermally superconducting heat transfer medium disposed on surfaces of the interior volume of the heat spreader.

6. The light emitting apparatus as set forth in claim 1, wherein the thermally superconducting heat transfer medium comprises:
a first layer comprising at least one compound selected from the group consisting of sodium peroxide, sodium oxide, beryllium oxide, manganese sesquioxide, aluminum dichromate, calcium dichromate, boron oxide, dichromate radical, and combinations thereof;
a second layer comprising at least one compound selected from the group consisting of cobaltous oxide, manganese sesquioxide, beryllium oxide, strontium chromate, strontium carbonate, rhodium oxide, cupric oxide, β-titanium, potassium dichromate, boron oxide, calcium dichromate, manganese dichromate, aluminum dichromate, dichromate radical, and combinations thereof; and
third layer comprising at least one compound selected from the group consisting of denatured rhodium oxide, potassium dichromate, denatured radium oxide, sodium dichromate, silver dichromate, monocrystalline silicon, beryllium oxide, strontium chromate, boron oxide, sodium peroxide, β-titanium, a metal dichromate, and combinations thereof.

7. The light emitting apparatus as set forth in claim 1, wherein the heat spreader is elongated in a direction transverse to the electrically insulating board to define a post.

8. The light emitting apparatus as set forth in claim 1, wherein the heat spreader defines a sub-mount.

9. The light emitting apparatus as set forth in claim 1, wherein the heat spreader is laterally substantially coextensive with the electrically insulating board.

10. The light emitting apparatus as set forth in claim 1, wherein the thermally superconducting heat transfer medium has a thermal conductivity at least 20000 times greater than the thermal conductivity of silver.

11. A light emitting apparatus comprising:
a plurality of light emitting chips;
a printed circuit board on which the plurality of light emitting chips is disposed, the printed circuit board including printed circuitry electrically interconnecting the plurality of light emitting chips; and a thermally superconducting heat transfer medium in an enclosed volume that is in thermal communication with all of the plurality of light emitting chips, the thermally superconducting heat transfer medium having a finite thermal conductivity that is at least 1500 times larger than the thermal conductivity of copper, the thermally superconducting heat transfer medium spreading heat generated by the plurality of light emitting chips to reduce thermal non-uniformities across the printed circuit board such that the printed circuit board is a substantially isothermal printed circuit board.

12. The light emitting apparatus as set forth in claim 11, wherein the thermally superconducting heat transfer medium comprises:
   a first layer comprising at least one compound selected from the group consisting of sodium peroxide, sodium oxide, beryllium oxide, manganese sesquioxide, aluminum dichromate, calcium dichromate, boron oxide, dichromate radical, and combinations thereof;
   a second layer comprising at least one compound selected from the group consisting of cobaltous oxide, manganese sesquioxide, beryllium oxide, strontium chromate, strontium carbonate, rhodium oxide, cupric oxide, β-titanium, potassium dichromate, boron oxide, calcium dichromate, manganese dichromate, aluminum dichromate, dichromate radical, and combinations thereof; and
   third layer comprising at least one compound selected from the group consisting of denatured rhodium oxide, potassium dichromate, denatured radium oxide, sodium dichromate, silver dichromate, monocrystalline silicon, beryllium oxide, strontium chromate, boron oxide, sodium peroxide, β-titanium, a metal dichromate, and combinations thereof.

13. The light emitting apparatus as set forth in claim 11, further comprising:
   a heat sink, the thermally superconducting heat transfer medium disposed between the heat sink and the printed circuit board, the thermally superconducting heat transfer medium further absorbing heat from the printed circuit board and transferring the absorbed heat to the heat sink.

14. The light emitting apparatus as set forth in claim 11, further comprising:
   a generally planar support on which the printed circuit board is mounted, the generally planar support defining the enclosed volume enclosing the thermally superconducting heat transfer medium.

15. The light emitting apparatus as set forth in claim 11, wherein the thermally superconducting heat transfer medium is a powder-based thermally superconducting heat transfer medium.

* * * * *